(12) United States Patent
Takahashi (10) Patent No.: US 8,128,447 B2
(45) Date of Patent: Mar. 6, 2012

(54) DISPLAY DEVICE MANUFACTURING METHOD AND DISPLAY DEVICE PRODUCED THEREBY

(75) Inventor: Toshiro Takahashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 518 days.

(21) Appl. No.: 12/054,113

(22) Filed: Mar. 24, 2008

(65) Prior Publication Data

US 2008/0238306 A1    Oct. 2, 2008

(30) Foreign Application Priority Data

Mar. 30, 2007   (JP) ................. 2007-090852

(51) Int. Cl.
*H01J 9/00* (2006.01)
(52) U.S. Cl. ......................... 445/24; 313/500
(58) Field of Classification Search ........... 313/498–512
See application file for complete search history.

(56) References Cited

U.S. PATENT DOCUMENTS

| 6,771,028 B1* | 8/2004 | Winters ............... 315/169.1 |
| 2002/0072139 A1* | 6/2002 | Kashiwabara ............ 438/29 |
| 2008/0026198 A1* | 1/2008 | Komada et al. ............ 428/219 |

FOREIGN PATENT DOCUMENTS

| JP | 7-78690 A | 3/1995 |
| JP | 2002-15859 A | 1/2002 |
| JP | 2004-361774 A | 12/2004 |

* cited by examiner

*Primary Examiner* — Anne Hines
(74) *Attorney, Agent, or Firm* — Birch, Stewart, Kolasch & Birch, LLP (57) ABSTRACT

A display device manufacturing method including arraying pixels 20 comprising plural sub-pixels with different light-emitting colors in two intersecting directions on a flexible substrate 12 by patterning plural sub-pixels 14, 16, 18 with different light-emitting colors onto the flexible substrate 12, wherein patterning of the sub-pixels is performed such that from the two directions of pixel array, the plural sub-pixels with different light-emitting colors are arrayed within the pixels in a rows along the direction X with the smaller substrate dimensional change ratio.

16 Claims, 5 Drawing Sheets

DISPLAY DEVICE MANUFACTURING METHOD AND DISPLAY DEVICE PRODUCED THEREBY

CROSS-REFERENCE TO RELATED APPLICATION

This application claims priority under 35 USC 119 from Japanese Patent Application No. 2007-90852, the disclosure of which is incorporated herein by reference.

BACKGROUND OF THE INVENTION

1. Field of the Invention

The present invention relates to a manufacturing method for a display device using an organic electroluminescence element (organic EL element) and to a display device manufactured thereby.

2. Description of the Related Art

Figure 7:
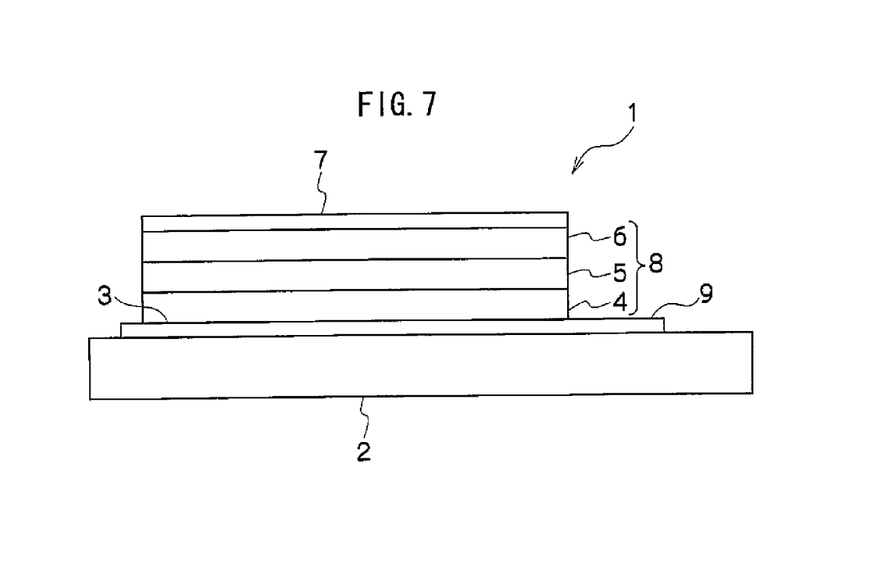
FIG. 7 is a schematic view showing an example of a configuration of an organic EL element.

In recent years, flat panel display device including liquid crystal element, organic EL element or the like are widely used. FIG. 7 schematically shows the structure of an organic EL element 1. An anode 3, an organic EL layer 8 including a hole transporting layer 4, a light-emitting layer 5, and an electron transporting layer 6, a cathode 7, and others are formed on a substrate 2 made of, for example, glass. Upon application of an electric field to the electrodes 3 and 7 through a lead 9, the region of the light-emitting layer 5 sandwiched between the electrodes 3 and 7 is excited to emit light.

Generally, when displaying color, it is necessary to array plural pixels that include sub-pixels with different light-emitting colors to each other, such as red (R), green (G) and blue (B), on a substrate in two perpendicular directions, for example in columns and rows.

In order to manufacture a display device for color display using an organic EL element, for example, an anode in a stripe pattern may be formed on a substrate, and then organic coloring materials may be vapor deposited in sequence on the anode to form organic EL layers corresponding to RGB, the organic EL layers being exposed in a repeating pattern. A cathode may then be formed on the organic EL layers, such that adjacent RGB organic EL layer portions that have been sandwiched between the electrodes each form sub-pixels, these sub-pixels together configuring single pixels. Multiple of these pixels that include the RGB sub-pixels are thereby arrayed in two directions, columns and rows, on a substrate.

Regarding such a substrate, display devices have been proposed that use, instead of a glass substrate, a flexible substrate, such as a resin film or metal plate (see, for example, Japanese Patent Application Laid-Open (JP-A) No. 7-78690, JP-A No. 2002-15859, and JP-A No. 2004-361774). By the use of a flexible substrate that does not crack even when bent by a large degree, a display device with high impact resistance may be provided. In particular flexible substrates formed from a resin film have the merits of high transmittance and light weight.

During the manufacture of a display device using a flexible substrate formed from a resin film, in particular, in the process before film forming of the organic EL layers, if the amount of dimensional change of the substrate differs when forming, for example, the electrodes (anode), insulating layer, dividers and the like, then when the organic light-emitting layers corresponding to RGB are formed as films, the positions of the sub-pixels may be misaligned to a great extent from the design positions thereof.

Figure 8:
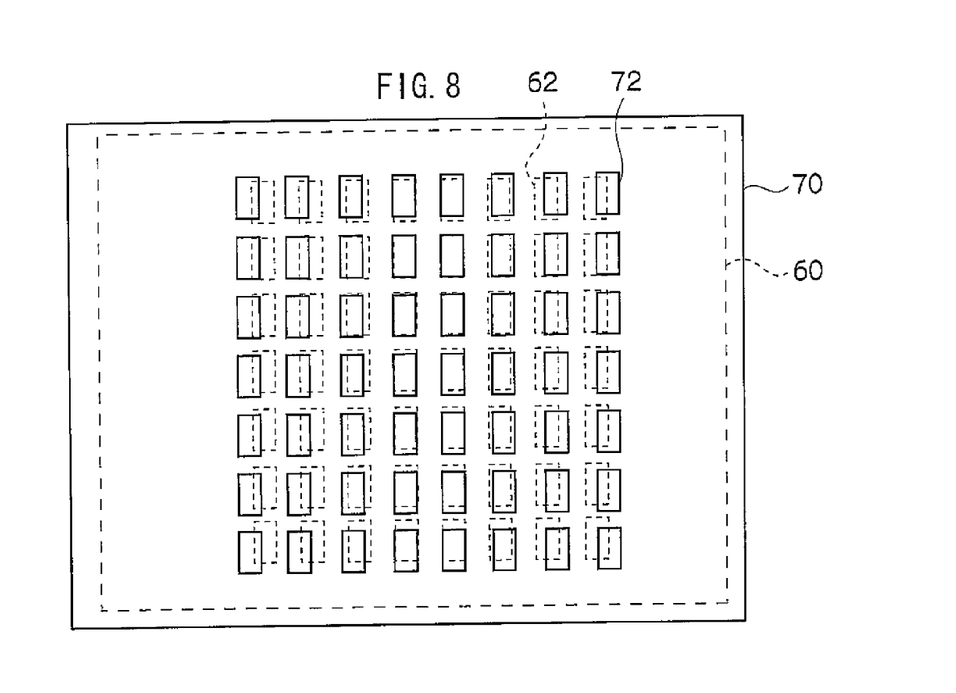
FIG. 8 is a schematic view showing misalignment from electrode design positions.
Figure 9:
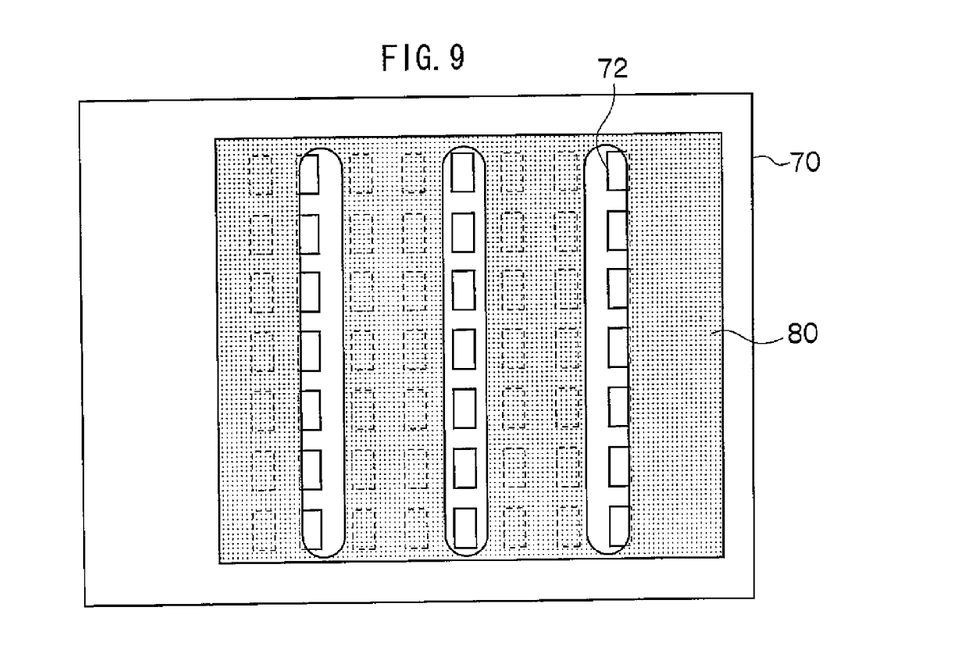
FIG. 9 is a schematic view showing misalignment when light-emitting layers corresponding to RGB are formed with mask vapor deposition.

FIG. 8 schematically shows misalignment of electrodes, which form the sub-pixels of organic light-emitting layers that correspond to RGB within the pixels, from the design position of the electrodes. When the initial substrate 60 expands in the processes before film forming of the organic EL layers, with a large amount of dimensional change, then portions of electrodes 72 on a substrate 70 are greatly misaligned from the design positions 62. If the position of the electrodes 72 on the substrate 70 are greatly misaligned from the design positions 62 then, as shown in FIG. 9, when forming the light-emitting layers that form the sub-pixels with mask vapor deposition using a shadow mask 80, the margin for separate patterning process by vapor deposition is decreased, and separate patterning process by vapor deposition may not be possible in some cases. It should be noted that this type of problem is not limited to separate patterning process by mask vapor deposition; for example, when coating separation is carried out by a transfer method, if the electrodes are greatly misaligned from their design positions, then problems occur with reduced margin for separate patterning process or separate patterning process becomes impossible.

SUMMARY OF THE INVENTION

The present invention has been made in view of the above circumstances and provides the following display device manufacturing method and display device manufactured thereby.

A first aspect of the present invention provides a display device manufacturing method including: arraying pixels, which include plural sub-pixels with different light-emitting colors, in two intersecting directions on a flexible substrate by patterning the plural sub-pixels with different light-emitting colors onto the flexible substrate. Patterning of the sub-pixels is performed such that, from the two directions of pixel array, the plural sub-pixels with different light-emitting colors are arrayed within each of the pixels in a row along the direction with the smaller substrate dimensional change ratio from the two directions.

A second aspect of the present invention provides a display device manufacturing method including: arraying pixels, which include plural sub-pixels with different light-emitting colors, in two intersecting directions on a flexible substrate by patterning the plural sub-pixels with different light-emitting colors onto a flexible substrate using photolithography. Patterning of the sub-pixels is performed such that, from the two directions of pixel array, the plural sub-pixels with different light-emitting colors are arrayed within each of the pixels in a row along the direction with the smaller substrate dimensional change ratio between before and after the photolithographic process.

DETAILED DESCRIPTION OF THE INVENTION

Explanation will be given below, with reference to the attached drawings, of manufacturing a display device with an organic EL element.

Figure 1:
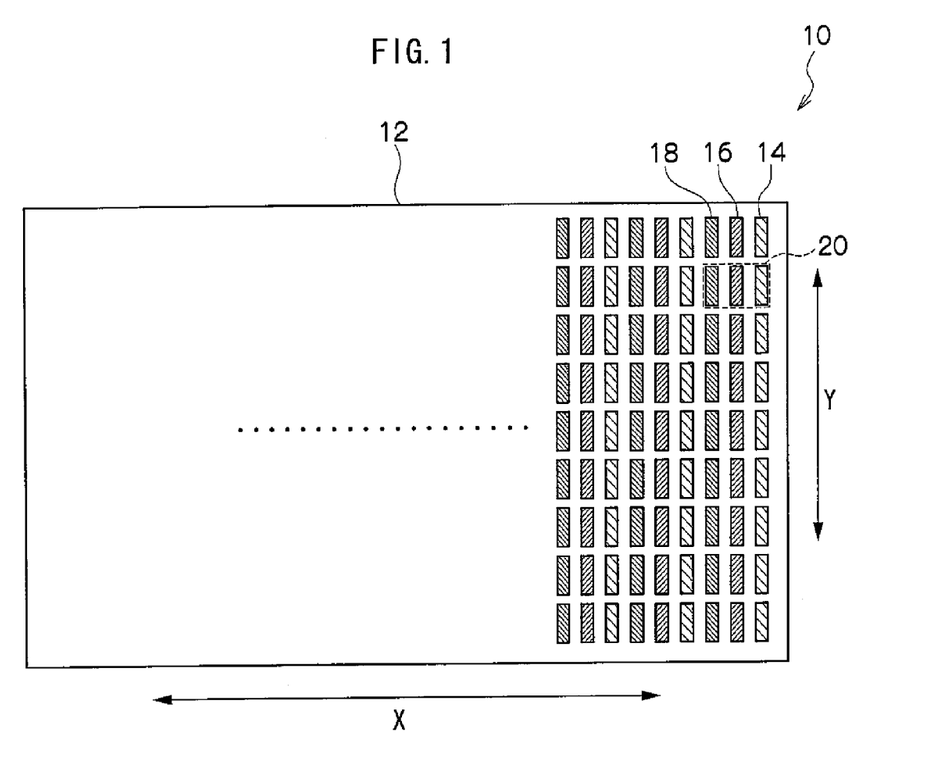
FIG. 1 is a schematic plan view showing an example of a pixel array on a flexible substrate according to the present invention.

FIG. 1 shows schematically an organic EL display device 10 with an example of a sub-pixel array that has been patterned onto a flexible resin film substrate (sometimes referred to below as a film substrate, flexible substrate, or, simply, substrate). The display device 10 has a rectangular film substrate 12 on which plural pixels 20 that include three color sub-pixels 14, 16, 18, RGB, arrayed in columns and rows.

Generally, in order to improve the mechanical strength, dimensional stability and heat stability, biaxially oriented films that have been stretched in two orthogonal directions are used for such a film substrate in such display devices, since there is directionality of the rigidity and extendibility when uniaxially oriented resins are used, such as films of PEN (polyethylene naphthalate) or PET (polyethylene terephthalate). This means that no particular consideration is given to the substrate orientation when such biaxial stretched films are used as flexible substrates when manufacturing display elements conventionally.

However, biaxially oriented films are formed into a film shape by a roll-to-roll (R to R) process, and so the force that is applied thereto is not the same in the longitudinal and lateral directions, and so the dimensional stability and heat stability of the films do in fact depend on the axial direction. The inventors' research has revealed that when manufacturing display device using flexible substrates, even if, for example, a 200 mm×200 mm biaxially oriented film is used as such a substrate, the dimensions of the substrate change due to heating in the patterning process, or due to solvents in a photolithographic process, and a difference of the order of 200 μm may occur in the extension depending on the axial direction.

However, pixels are often arrayed on the substrate at a side length of several tens of μm to several hundreds of μm, and, when plural sub-pixels are formed within a small area, the slightest difference in the dimensional change ratio of the substrate has a great influence on the precision of patterning.

In order to address the above, the inventors have considered the difference in dimensional change ratio of flexible substrates such as the above, and discovered a way in which the misalignment of each sub-pixel from the design positions thereof may be suppressed to the lowest amount by performing patterning such that the sub-pixels within each of the pixels are arrayed in a row along the direction of smaller dimensional change ratio of the substrate.

<Substrate>

For substrates for use in the present invention, flexible substrates that are capable of being used as substrates in display devices may be used without any particular limitation thereto, and the following, for example, may be used: biaxially oriented resin films, such as polyesters composed of polyethylene terephthalate, polybutylene phthalate, polyethylene naphthalate, or the like; polystyrene, polycarbonate, polyethersulfone, polyarylate, polyimide, polycycloolefins, norbornene resin, and poly (chlorotrifluoroethylene). Film substrates such as the above have high transmission characteristics and rigidity, and may be appropriately applied as display device substrates.

The thickness of such a flexible substrate may be determined according to such factors as the purpose of use of the display device. However, considering characteristics of a display device substrate, such as the rigidity, transmission characteristics and flexibility, the thickness is preferably from 50 μm to 1 mm, with 100 μm to 300 μm being more preferable.

Furthermore, gas barrier coats for preventing the permeation of moisture and oxygen, hard coat layers for preventing scratching of the organic EL element, and undercoat layers for improving the flatness and anode adhesion, may be appropriately used on such resin flexible substrates.

<Organic EL Element>

An organic EL element that includes light-emitting layers is formed on such flexible substrates. There are no particular limitations to the display method of the display device according to the present invention, as long as plural sub-pixels of different colors can be arrayed in stripes in two intersecting directions. Explanation will mainly be given below focusing on forming an organic EL element by separate patterning process.

There are no particular limitations to the layer configuration of such an organic EL device, and the configuration thereof may be appropriately determined according to the purpose of use. Explanation is given below with respect to the following layer configuration, however, the present invention is not limited thereto.

Anode/light-emitting layer/cathode

Anode/hole transporting layer/light-emitting layer/electron transporting layer/cathode Anode/hole transporting layer/light-emitting layer/blocking layer/electron transporting layer/cathode Anode/hole transporting layer/light-emitting layer/blocking layer/electron transporting layer/electron injecting layer/cathode Anode/hole injecting layer/hole transporting layer/light-emitting layer/blocking layer/electron transporting layer/cathode Anode/hole injecting layer/hole transporting layer/light-emitting layer/blocking layer/electron transporting layer/electron injecting layer/cathode For example, as shown in FIG. 1, in order to array pixels 20 including three colors of sub-pixels 14, 16, 18, RGB, in orthogonally intersecting directions (columns and rows) on the film substrate 12, electrode patterning is performed in such a manner that sub-pixel electrodes for forming the sub-pixels 14, 16, 18 within each of the pixels 20 are lined up in a row along the direction of smaller dimensional change ratio of the film substrate 12 (direction X in FIG. 1).

During forming of the electrodes by, for example, sputtering, CVD or the like, when electrode forming using a mask, the precision of the electrode positions for forming the sub-pixels is greatly influenced by expansion (elongation) of the film substrate 12 caused by heat during such forming of the electrodes. The elongation of the film substrate 12 is different in directions even if the film is a biaxial oriented film, since the force applied thereto is not uniform in the longitudinal and lateral directions. Therefore, the dimensional change ratio of the film substrate 12 during film forming of the electrodes is different, depending on the orientation.

In this respect, the dimensional change ratio of the film substrate 12 may be determined according to factors such as the temperatures to which the film substrate 12 will be exposed during patterning. Therefore, for example, when patterning is performed by mask vapor deposition, the dimensional change ratio may be determined based on the difference in the dimensions of the film substrate 12 at a temperature close to the temperature during film forming, from the dimensions of the film substrate 12 at room temperature. Specifically, the substrate dimensions in the longitudinal and lateral directions of the flexible substrate for measurement are measured at 20° C. and 80° C. ($L_{20}$, $L_{80}$), and by calculating the dimensional change ratio (an absolute value) as expressed by ($L_{80}-L_{20}$)/$L_{20}$, the direction of larger dimensional change ratio (a first direction) and the direction of smaller dimensional change ratio (a second direction) may be established in advance. After establishing the direction of larger dimensional change ratio of the film substrate 12 in such a manner, flexible substrates that have been manufactured in the same manner as the substrate used for measurement may be used, and patterning may be carried out of the electrodes forming the sub-pixels on the substrate.

<Anode>

Anodes may be formed as striped patterns of parallel electrodes. Well known materials may be suitably used for the anode, such as, for example, conductive metal oxides like antimony or fluorine doped tin oxide (ATO, FTO), tin oxide, zinc oxide, indium oxide, indium tin oxide (ITO), indium zinc oxide (IZO), aluminum and gallium doped zinc oxide (AZO, GZO). The anode may be formed in a striped pattern on the substrate by, for example, sputtering vapor deposition, using anode materials such as these.

Electrodes are film formed by such methods as sputtering or CVD, and, in a photolithographic process, a resist is coated on the film substrate 12, and light-exposure, alkali development and resist removal with a solvent are carried out. The dimensions of the film substrate 12 are readily changed in such a photolithographic process.

With regard to the above, it is preferable when carrying out sub-pixel electrode patterning by photolithography that each of the sub-pixels within the pixels are arrayed in the direction with the smaller dimensional change ratio between before and after the photolithographic process, from the two intersecting directions that the pixels are arrayed on the substrate.

After the electrodes have been formed, an insulating layer and partitioning walls are formed, and when forming the apertures for the sub-pixels 14, 16, 18, patterning of the apertures of the sub-pixels 14, 16, 18 is carried out such that the apertures are arrayed within each of the pixels in a row on the film substrate 12 along the direction in which there is the smaller dimensional change ratio, from the two directions, column and row directions, on the substrate 12. By forming the electrodes and the apertures for forming the sub-pixels in a row along the direction of the substrate with the smaller dimensional change ratio, the precision of separate patterning process may be improved in vapor deposition for a stripe array of sub-pixels 14, 16, 18.

<Organic EL Layer>

There are no particular limitations to the configuration, thickness, materials or the like of the layer for forming the organic EL layer, as long as the organic EL layer includes at least a light-emitting layer that displays a predetermined light-emitting color when a voltage is applied thereto, and well known configurations and materials may be used for such a layer.

The light-emitting layer may, for example, include at least one type of light-emitting material, and hole transporting materials, electron transporting materials and/or host materials may be included as required. There are no particular limitations to the light-emitting materials, and both fluorescent light-emitting materials and phosphorescent light-emitting materials may be used.

Examples that may be given of fluorescent light-emitting materials include, for example, benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidine compounds, various metal complexes, typified by metal complexes and rare earth complexes of 8-quinolinol derivatives, and polymer compounds such as polythiophene derivatives, polyphenylene derivatives, polyphenylene vinylene derivatives, and polyfluorene derivatives. These materials may used singly, or in combinations of two or more thereof.

There are no particular limitations to phosphorescent light-emitting materials, but orthometalated metal complexes or porphyrin metal complexes are preferable.

There are various ligands that may be used for forming the above orthometalated metal complexes, and examples that may be given of preferable ligands include 2-phenylpyridine derivatives, 7,8-benzoquinoline derivatives, 2-(2-thienyl)pyridine derivatives, 2-(1-naphthyl)pyridine derivatives, and 2-phenyl quinoline derivatives. These derivatives may be substituted as required. Furthermore, the above orthometalated metal complexes may include the above ligands together with other ligands.

Platinum porphyrin complexes are preferable porphyrin metal complexes.

Phosphorescent light-emitting materials may be used singly, or in combinations of two or more. Furthermore, fluorescent light-emitting materials and phosphorescent light-emitting materials may be used together.

Figure 2:
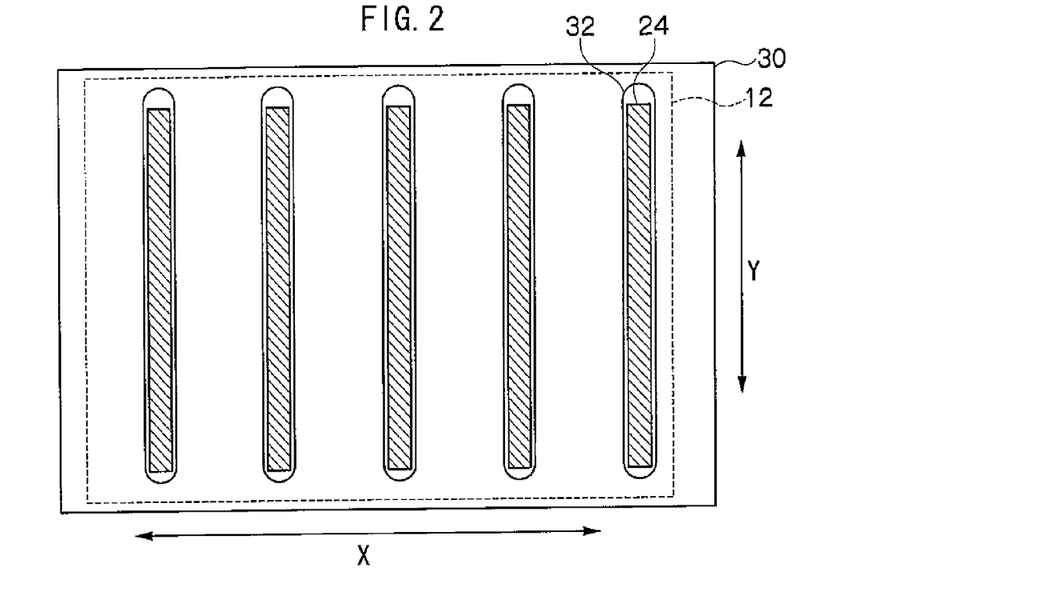
FIG. 2 is a schematic view showing an example of a mask vapor deposition method for a light-emitting layer corresponding to R.
Figure 3:
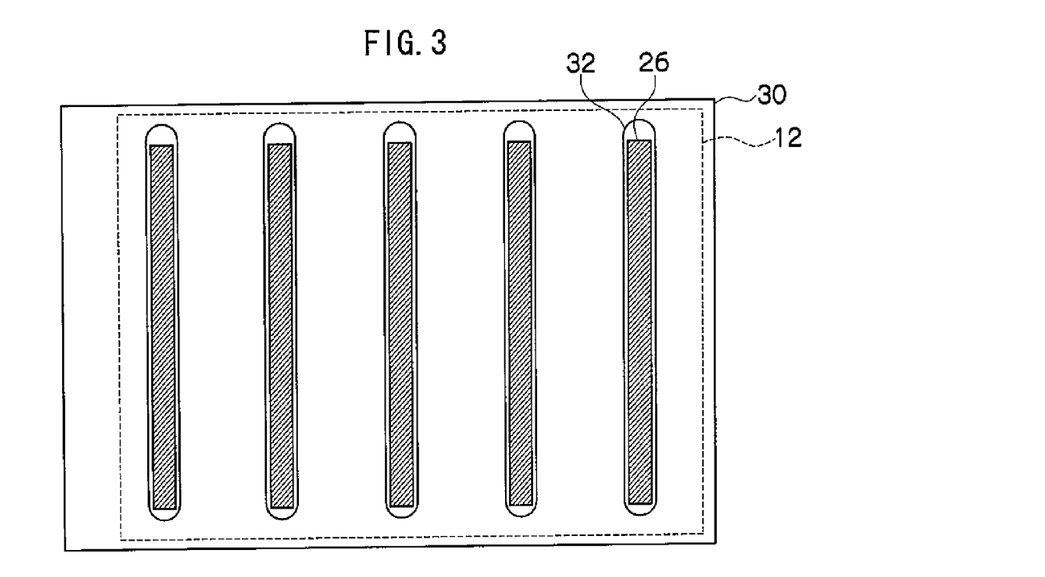
FIG. 3 is a schematic view showing an example of a method for mask vapor deposition of a light-emitting layer corresponding to G.
Figure 4:
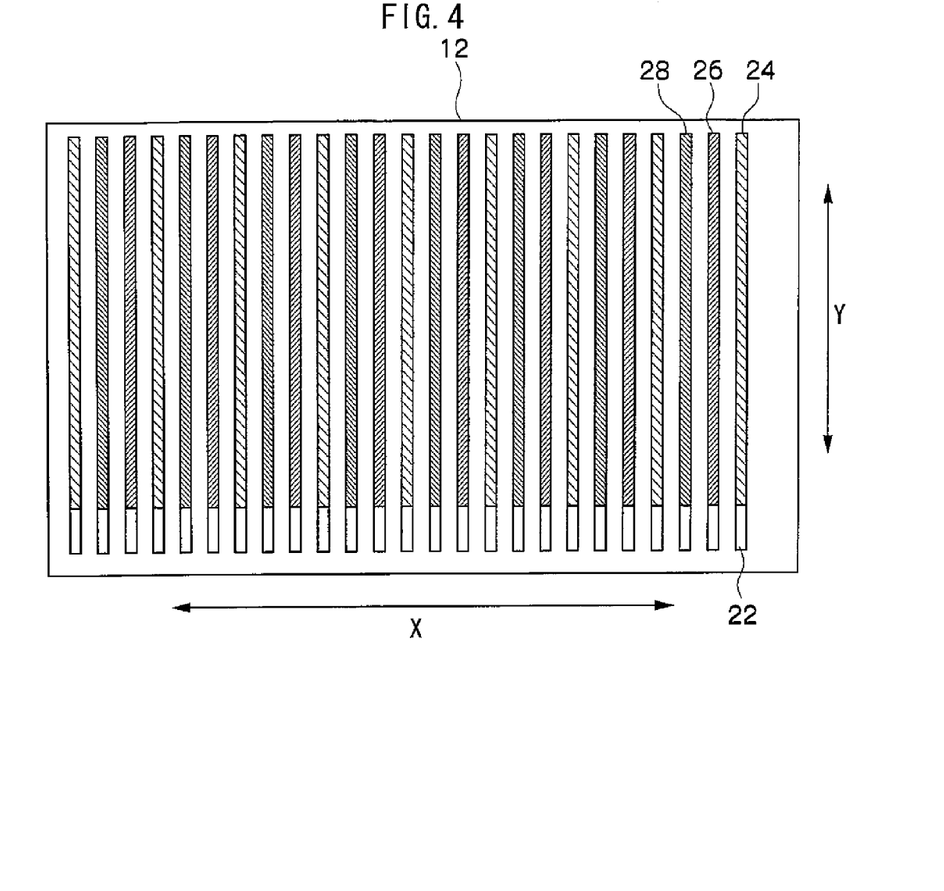
FIG. 4 is a schematic plan view showing a state in which light-emitting layers corresponding to RGB have been formed on an anode.

After forming a hole transporting layer or the like, as required, on an anode that has been formed in a stripe pattern, light-emitting layers corresponding to RGB are formed in sequence using a mask (shadow mask) that has holes (apertures) formed therein according to the size of the RGB sub-pixels. For example, as shown in FIG. 2, a light-emitting layer 24 that corresponds to R may be vapor deposited through apertures 32 in a mask 30. Then, as shown in FIG. 3, the mask 30 may be moved by the amount of a predetermined pitch with respect to the film substrate 12, and a light-emitting layer 26 that corresponds to G may be vapor deposited. In this manner, by splitting the light-emitting layers 24, 26, 28 that make up the RGB sub-pixels into three and carrying out sequential vapor deposition, the light-emitting layers 24, 26, 28 that respectively correspond to R,G,B may be formed on an anode 22, as shown in FIG. 4.

The dimensional change ratio is large for the film substrate 12 with respect to the length direction of each of the light-emitting layers 24, 26, 28, (the Y direction) therefore misalignment from the design position in the length direction is greater from that in the width direction of each of the light-emitting layers 24, 26, 28. However, even if the misalignment of the light-emitting layers in their length direction is large, problems such as the overlapping of the light-emitting layers 24, 26, 28 do not occur.

After forming the light-emitting layers 24, 26, 28 corresponding to RGB, other layers, such as an electron transporting layer, may be formed thereon as required.

There is no limitation to forming each of the light-emitting layers 24, 26, 28 using mask vapor deposition in the manner described above, and, for example, a printing method may be employed.

Figure 5:
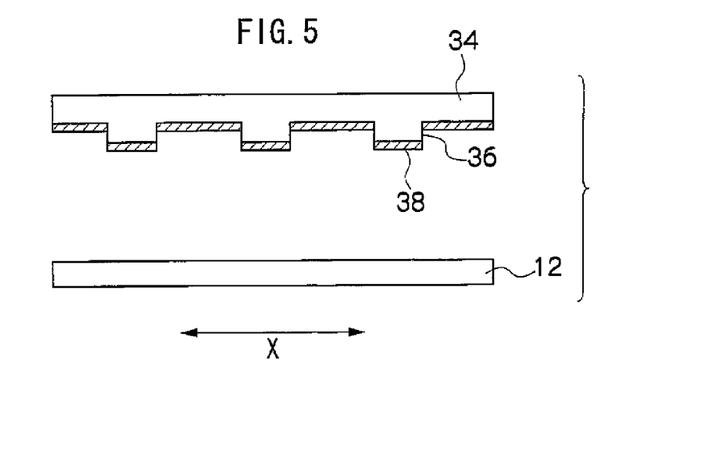
FIG. 5 is a schematic view showing a method of transferring light-emitting layers onto a flexible substrate using a mold.

Furthermore, light-emitting layers of an organic EL element may be formed on a flexible substrate using mold transfer. For example, as shown in FIG. 5, material 38 for forming the light-emitting layers may be vapor deposited on the surface of a mold 34 that is a substrate, such as of glass, with protrusions 36 formed into a striped pattern on the surface thereof. The mold 34 may then be aligned and brought together with the film substrate 12, and the material 38 that is deposited on the protrusions 36 may be transferred onto the film substrate 12.

By carrying out such mold transfer for each of the colors, the substrate dimensional change may be suppressed to a small amount by not exposing the film substrate 12 to the high temperatures involved during vapor deposition. In such a case, the electrodes forming the RGB sub-pixels within each pixel are formed so as to be arrayed in a row along the direction of smaller dimensional change ratio (the direction X in FIG. 5), and the misalignment of each of the light-emitting layers may be further suppressed, and high precision patterning may be performed.

<Cathode>

Figure 6:
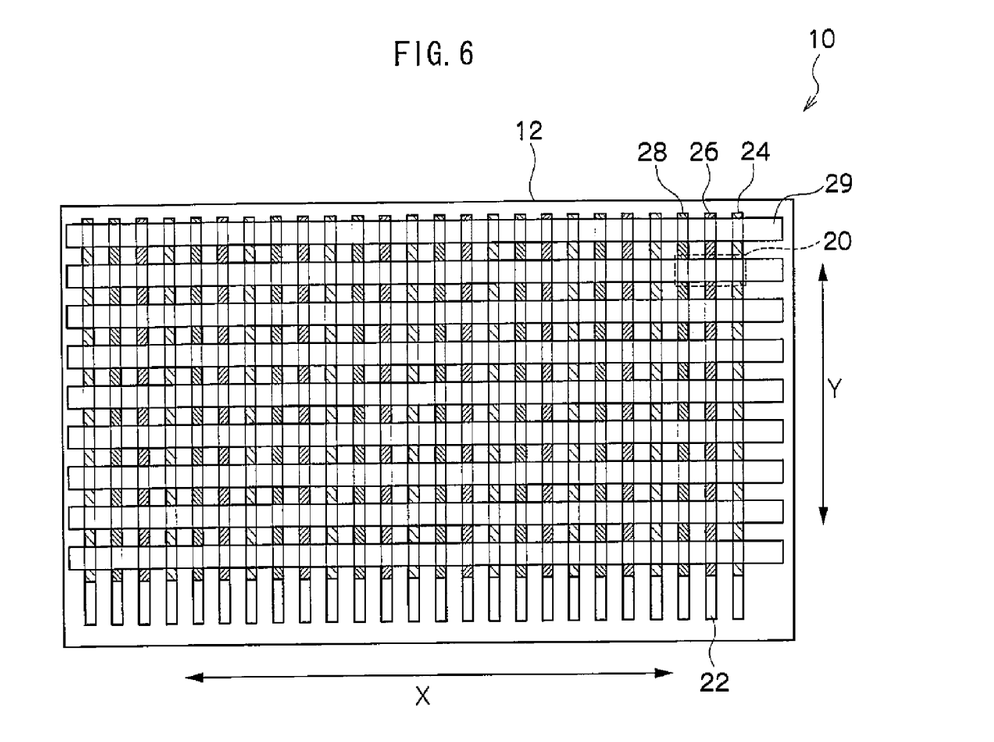
FIG. 6 is a schematic plan view showing a state in which a cathode has been formed on organic EL layers.

A cathode is formed after the organic EL layer including the light-emitting layers has been formed. A cathode 29 may be formed in a striped pattern and orthogonal to the anode 22, as shown in FIG. 6. There are no particular limitations to the material for configuring the cathode 29, and the cathode 29 may be formed by sputtering vapor deposition using well known materials, such as Al, MgAg, AlLi. Portions of the organic EL element that include the adjacent light-emitting layers 24, 26, 28, corresponding respectively to RGB sandwiched between the two electrodes 22, 29, make up sub-pixels, and these adjacent sub-pixels together configure pixels 20. In this manner, plural pixels 20 including the RGB sub-pixels are arrayed on the film substrate 12 in orthogonal directions, columns and rows.

<Sealing Member and the Like>

After the cathode 29 has been formed, the configuration may be covered with a sealing member (protection layer), in order to suppress deterioration of the organic EL element due to moisture and oxygen. Materials such as glass, metals, and plastics may be used as the sealing member.

After sealing, external lines (driving circuit) are connected to each of the electrodes. By applying a voltage to each of the electrodes 22, 29, the light-emitting layers 24, 26, 28 of the organic EL layer that have been sandwiched between the electrodes 22, 29 are caused to emit light according to their respective colors.

The display device 10 may be manufactured through the above processes, so that, as shown in FIG. 1, plural pixels 20 including RGB sub-pixels 14, 16, 18 are arrayed in columns and rows on a film substrate 12. Since the display device 10 that has been manufactured in the above manner has sub-pixels (light-emitting layers) 14, 16, 18 arrayed, within the pixels 20, in a row along the direction of smaller dimensional change ratio (direction X), misalignment from the design positions is small, and a high precision display device is enabled. Therefore, when carrying out continuous production of organic EL display devices, both quality and yield may be reliably improved by employing the method of the present invention.

The present invention has been explained above, however, the present invention is not limited to the above embodiment.

For example, the flexible substrate is not limited to biaxially oriented films, and film substrates that have been formed by another manufacturing method may be used.

Furthermore, the present invention may be applied to display devices in which pixels including plural sub-pixels of different light-emitting colors that are arrayed in two intersecting directions on a flexible substrate, and the present invention may be applied, for example, to the manufacture of display devices such as organic EL display devices that are provided with multiphoton emission elements of plural stacked organic EL layers, and other display devices that use inorganic EL elements, plasma elements, or electric migration elements.

There is also no limitation to the method of electrical driving, and the present invention may be applied both to passive matrix display devices and to active matrix display devices. The display device is also not limited to full-color displays, and the present invention may also be applied to the manufacture of for example, area-color displays. The present invention may also be applied to both double sided display devices and single sided display devices.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A display device manufacturing method comprising:
arraying pixels, which comprise a plurality of sub-pixels with different light-emitting colors, in two intersecting directions on a flexible substrate, by patterning the plurality of sub-pixels with different light-emitting colors onto the flexible substrate,
wherein the flexible substrate has a difference in a dimensional change ratio between the two directions of the substrate and dimensions of the flexible substrate change in the patterning process, and
wherein patterning of the sub-pixels is performed such that, from the two directions of the pixel array, within each of the pixels the plurality of sub-pixels with different light-emitting colors are arrayed in a row along the direction with the smaller substrate dimensional change ratio.

2. The display device manufacturing method of claim 1, wherein the substrate dimensional change ratio is the substrate thermal dimensional change ratio, the thermal dimensional change ratio being an absolute value expressed by $(L_{80}-L_{20})/L_{20}$ in which $L_{20}$ and $L_{80}$ are lengths of the substrate measured at 20° C. and 80° C. with respect to one of the two directions of the substrate, respectively.

3. The display device manufacturing method of claim 2, wherein the pixels are formed from organic EL elements.

4. The display device manufacturing method of claim 3, further comprising forming light-emitting layers of the organic EL elements by mask vapor deposition or mold transfer.

5. A display device that has been manufactured by the method of claim 4.

6. The display device manufacturing method of claim 1, wherein the pixels are formed from organic EL elements.

7. The display device manufacturing method of claim 6, further comprising forming light-emitting layers of the organic EL elements by mask vapor deposition or mold transfer.

8. A display device that has been manufactured by the method of claim 1.

9. A display device manufacturing method comprising:
arraying pixels, which comprise a plurality of sub-pixels with different light-emitting colors, in two intersecting directions on a flexible substrate, by patterning the plurality of sub-pixels with different light-emitting colors onto the flexible substrate using photolithography,
wherein the flexible substrate has a difference in a dimensional change ratio between the two directions of the substrate and dimensions of the flexible substrate change in the patterning process, and
wherein patterning of the sub-pixels is performed such that, from the two directions of the pixel array, within each of the pixels the plurality of sub-pixels with different light-emitting colors are arrayed in a row along the direction with the smaller substrate dimensional change ratio between before and after the photolithographic process.

10. The display device manufacturing method of claim 9, wherein the substrate dimensional change ratio is the substrate thermal dimensional change ratio, the thermal dimensional change ratio being an absolute value expressed by $(L_{80}-L_{20})/L_{20}$ in which $L_{20}$ and $L_{80}$ are lengths of the substrate measured at 20° C. and 80° C. with respect to one of the two directions of the substrate, respectively.

11. The display device manufacturing method of claim 10, wherein the pixels are formed from organic EL elements.

12. The display device manufacturing method of claim 11, further comprising forming light-emitting layers of the organic EL elements by mask vapor deposition or mold transfer.

13. A display device that has been manufactured by the method of claim 12.

14. The display device manufacturing method of claim 9, wherein the pixels are formed from organic EL elements.

15. The display device manufacturing method of claim 14, further comprising forming light-emitting layers of the organic EL elements by mask vapor deposition or mold transfer.

16. A display device that has been manufactured by the method of claim 9.

* * * * *